US012588398B2

(12) United States Patent
Lee et al.

(10) Patent No.: US 12,588,398 B2
(45) Date of Patent: Mar. 24, 2026

(54) TOUCH DISPLAY PANEL AND PREPARATION METHOD THEREOF, AND DISPLAY APPARATUS

(71) Applicants:Chengdu BOE Optoelectronics Technology Co., Ltd., Sichuan Province (CN); BOE Technology Group Co., Ltd., Beijing (CN)

(72) Inventors: Jaeho Lee, Beijing (CN); Dongyu Gao, Beijing (CN); Guangri Yu, Beijing (CN); Cheng Zeng, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 525 days.

(21) Appl. No.: 18/044,755

(22) PCT Filed: Jun. 30, 2022

(86) PCT No.: PCT/CN2022/102950
§ 371 (c)(1),
(2) Date: Mar. 9, 2023

(87) PCT Pub. No.: WO2024/000454
PCT Pub. Date: Jan. 4, 2024

(65) Prior Publication Data
US 2024/0292720 A1 Aug. 29, 2024

(51) Int. Cl.
*H10K 59/80* (2023.01)
*G06F 3/041* (2006.01)
(Continued)

(52) U.S. Cl.
CPC ......... *H10K 59/879* (2023.02); *G06F 3/0412* (2013.01); *G06F 3/0445* (2019.05);
(Continued)

(58) Field of Classification Search
CPC .... H10K 59/879; H10K 59/122; H10K 59/38; H10K 59/40; H10K 50/858; H10K 59/00;
(Continued)

(56) References Cited

U.S. PATENT DOCUMENTS

| 2017/0102579 A1 | 4/2017 | Wang |
| 2019/0013362 A1 | 1/2019 | Qi et al. |

(Continued)

FOREIGN PATENT DOCUMENTS

| CN | 104793392 A | 7/2015 |
| CN | 110491901 A | 11/2019 |

(Continued)

*Primary Examiner* — Ermias T Woldegeorgis
(74) *Attorney, Agent, or Firm* — Workman Nydegger

(57) ABSTRACT

A touch display panel and a preparation method, and a display apparatus. The touch display panel includes: a first base substrate, including sub-pixel regions; a group of light emitting devices, corresponding to the sub-pixel regions one to one; a first pixel defining layer, including first opening regions corresponding to the sub-pixel regions one to one; a group of quantum dot layers, in at least part of the first opening regions; a touch module, including a first touch electrode layer; and one layer of stacked insulation structure, configured to transmit light emitted by each quantum dot layer and reflect light emitted by the light emitting devices.

19 Claims, 10 Drawing Sheets

2

(51) Int. Cl.
    *G06F 3/044*        (2006.01)
    *H10K 59/122*    (2023.01)
    *H10K 59/38*     (2023.01)
    *H10K 59/40*     (2023.01)

(52) U.S. Cl.
    CPC ........... *H10K 59/122* (2023.02); *H10K 59/38*
          (2023.02); *H10K 59/40* (2023.02); *G06F*
                          *2203/04111* (2013.01)

(58) Field of Classification Search
    CPC ............ H10K 2102/331; G06F 3/0412; G06F
           3/0445; G06F 2203/04111; G06F 3/0446
    See application file for complete search history.

(56)                 References Cited

U.S. PATENT DOCUMENTS

| | | | |
|---|---|---|---|
| 2019/0196619 A1* | 6/2019 | Baek ..................... | H10K 59/122 |
| 2019/0348470 A1 | 11/2019 | Song et al. | |
| 2020/0006437 A1 | 1/2020 | Kim et al. | |
| 2021/0185776 A1* | 6/2021 | Lin ......................... | B41F 15/34 |
| 2022/0020821 A1 | 1/2022 | Kim | |
| 2022/0020965 A1 | 1/2022 | Park et al. | |

FOREIGN PATENT DOCUMENTS

| | | | | |
|---|---|---|---|---|
| CN | 110660928 A | 1/2020 | | |
| CN | 111341939 A | 6/2020 | | |
| CN | 112631022 A | 4/2021 | | |
| CN | 112993131 A * | 6/2021 | ........... | H10H 20/855 |
| CN | 113725385 A | 11/2021 | | |
| CN | 113937237 A | 1/2022 | | |
| CN | 113948551 A | 1/2022 | | |

* cited by examiner

RX 36 35

21
20
10

33

35

21
20
10

33 34

TX

TOUCH DISPLAY PANEL AND PREPARATION METHOD THEREOF, AND DISPLAY APPARATUS

CROSS-REFERENCE TO RELATED APPLICATIONS

The disclosure is a National Stage of International Application No. PCT/CN2022/102950, filed on Jun. 30, 2022, which is hereby incorporated by reference in their entireties.

FIELD

The present disclosure relates to the technical field of display, in particular to a touch display panel and a preparation method thereof, and a display apparatus.

BACKGROUND

An organic light emitting diode (OLED) has the characteristics of self-luminescence, wide viewing angle, wide color gamut, high contrast, and being light and thin, foldable, bendable, portable and the like, and has become a main direction of research and development in the display field. However, its luminescent spectrum is wide, and a color gamut coverage rate has reached the peak, which limits its development. A quantum dots light emitting diode (QLED), as a new technology, has attracted people's attention and research in recent years because of a quantum confinement effect of a quantum dot material itself, whose successive energy band changing into discrete energy levels to emit high-purity light with a small peak width. A quantum dots (QD)-OLED device with a relatively mature technology at this stage adopts a non-pixel blue OLED device as a backlight source, uses blue light to excite red light QD and green light QD to emit red light and green light, but the QD material itself has limited absorption of blue backlight, which limits a light emitting efficiency of the quantum dots, thereby affecting a front light output efficiency of a display device and the color gamut of a display.

SUMMARY

A touch display panel provided by an embodiment of the present disclosure includes:

a first substrate, including a plurality of sub-pixel regions;

a plurality of light emitting devices, located on one side of the first substrate and corresponding to the sub-pixel regions one to one;

a first pixel defining layer, located on sides, facing away from the first substrate, of the light emitting devices, and including first opening regions corresponding to the sub-pixel regions one to one;

a plurality of quantum dot layers, located on the sides, facing away from the first substrate, of the light emitting devices, and located in at least part of the first opening regions;

a touch module, located on sides, facing away from the light emitting devices, of the quantum dot layers, and including a first touch electrode layer; and at least one layer of stacked insulation structure, which is located between the quantum dot layers and the first touch electrode layer, and is for transmitting light emitted by each quantum dot layer and reflecting light emitted by the light emitting devices, where the stacked insulation structure includes a first refractive index layer and a second refractive index layer arranged on the whole layer: a refractive index of the first refractive index layer is smaller than a refractive index of the second refractive index layer: the second refractive index layer is located between the first refractive index layer and the quantum dot layers: the first refractive index layer includes a plurality of first refractive index patterns, and the first refractive index patterns correspond to the quantum dot layers one to one; and orthographic projections of the first refractive index patterns on the first substrate at least cover orthographic projections of the quantum dot layers on the first substrate.

In some embodiments, the touch module further includes: a first buffer layer located between the quantum dot layers and the first touch electrode layer, a second touch electrode layer located between the first touch electrode layer and the first buffer layer, and a first insulation layer located between the first touch electrode layer and the second touch electrode layer:

the second refractive index layer is located between the first buffer layer and the second touch electrode layer; and the first insulation layer includes second opening regions corresponding to the quantum dot layers one to one, and the first refractive index patterns are located in the second opening regions.

In some embodiments, in a direction perpendicular to the first substrate, a thickness of each first refractive index pattern is equal to a thickness of the first insulation layer.

In some embodiments, a material of the first refractive index patterns includes silicon oxide.

In some embodiments, a refractive index of each first refractive index pattern is greater than or equal to 1.45 and smaller than or equal to 1.55.

In some embodiments, a material of the first refractive index patterns includes one or a combination of: acrylic resin, polyurethane resin, silicone resin or epoxy resin.

In some embodiments, a refractive index of each first refractive index pattern is greater than or equal to 1.30 and smaller than or equal to 1.50.

In some embodiments, a material of the second refractive index layer includes silicon oxynitride.

In some embodiments, the refractive index of the second refractive index layer is greater than or equal to 1.65 and smaller than or equal to 1.75.

In some embodiments, the stacked insulation structure further includes:

a third refractive index layer, located between the first refractive index layer and the second refractive index layer: where a refractive index of the third refractive index layer is smaller than the refractive index of the second refractive index layer, and the refractive index of the third refractive index layer is not equal to the refractive index of the first refractive index layer.

In some embodiments, the third refractive index layer includes an organic matrix.

In some embodiments, a material of the organic matrix includes one or a combination of: silane resin or epoxy resin.

In some embodiments, the refractive index of the third refractive index layer is greater than or equal to 1.45 and smaller than or equal to 1.60.

In some embodiments, the refractive index of the third refractive index layer is smaller than the refractive index of the first refractive index layer.

In some embodiments, the refractive index of the third refractive index layer is greater than or equal to 1.25 and smaller than or equal to 1.45.

In some embodiments, the third refractive index layer further includes hollow particles dispersed in the organic matrix.

In some embodiments, the quantum dot layers are located in part of the first opening regions;

the touch display panel further includes: a plurality of first filling layers, located in the first opening regions except for the first opening regions in which the quantum dot layers are arranged; and an orthographic projection of the first refractive index layer on the first substrate does not overlap orthographic projections of the first filling layers on the first substrate.

In some embodiments, the touch display panel further includes: a first light transmission structure, which is located between the first filling layers and the first touch electrode layer, and is for transmitting light emitted by the light emitting devices;

where the first light transmission structure includes: a fourth refractive index layer, and a fifth refractive index layer located between the fourth refractive index layer and the first filling layers: a refractive index of the fourth refractive index layer is not equal to a refractive index of the fifth refractive index layer: the fifth refractive index layer includes second refractive index patterns corresponding to the first filling layers one to one: orthographic projections of the second refractive index patterns on the first substrate at least cover the orthographic projections of the first filling layers on the first substrate; and the orthographic projections of the second refractive index patterns on the first substrate do not overlap the orthographic projections of the quantum dot layers on the first substrate.

In some embodiments, the touch module includes the first buffer layer, and the first buffer layer is multiplexed as the fourth refractive index layer.

In some embodiments, an orthographic projection of the second refractive index layer on the first substrate covers the orthographic projections of the first filling layers on the first substrate.

In some embodiments, the touch display panel further includes a third refractive index layer, where an orthographic projection of the third refractive index layer on the first substrate covers the orthographic projections of the first filling layers on the first substrate.

In some embodiments, the plurality of light emitting devices are blue light emitting devices: the plurality of sub-pixel regions include a plurality of red sub-pixel regions, a plurality of blue sub-pixel regions and a plurality of green sub-pixel regions; and the quantum dot layers are only located in the first opening regions corresponding to the red sub-pixel regions and the green sub-pixel regions.

In some embodiments, the touch module includes the first touch electrode layer and the second touch electrode layer: an orthographic projection of the first touch electrode layer on the first substrate does not overlap orthographic projections of the first opening regions on the first substrate; and an orthographic projection of the second touch electrode layer on the first substrate does not overlap the orthographic projections of the first opening regions on the first substrate.

A preparation method of a touch display panel provided by an embodiment of the present disclosure includes:

providing a first substrate, where the first substrate includes a plurality of sub-pixel regions;

forming a plurality of light emitting devices on one side of the first substrate, where the light emitting devices correspond to the sub-pixel regions one to one;

forming a first pixel defining layer and a plurality of quantum dot layers on sides, facing away from the first substrate, of the light emitting devices: where the first pixel defining layer includes first opening regions corresponding to the sub-pixel regions one to one, and the quantum dot layers are located in at least part of the first opening regions;

forming a stacked insulation structure on sides, facing away from the light emitting devices, of the quantum dot layers: where the stacked insulation structure includes at least one group of a first refractive index layer and a second refractive index layer on the whole layer in a laminated mode: a refractive index of the first refractive index layer is smaller than a refractive index of the second refractive index layer: the second refractive index layer is located between the first refractive index layer and the quantum dot layers: the first refractive index layer includes a plurality of first refractive index patterns: the first refractive index patterns correspond to the quantum dot layers one to one; and orthographic projections of the first refractive index patterns on the first substrate at least cover orthographic projections of the quantum dot layers on the first substrate; and forming a first touch electrode layer on one side, facing away from the quantum dot layers, of the stacked insulation structure.

In some embodiments, before forming the stacked insulation structure on the sides, facing away from the light emitting devices, of the quantum dot layers, the method further includes:

forming a first buffer layer on the sides, facing away from the light emitting devices, of the quantum dot layers;

where the forming the stacked insulation structure on the sides, facing away from the light emitting devices, of the quantum dot layers, specifically includes:

forming a second refractive index layer on one side, facing away from the quantum dot layers, of the first buffer layer;

forming a pattern of the second touch electrode layer on one side, facing away from the first buffer layer, of the second refractive index layer;

forming a first insulation layer on one side, facing away from the second refractive index layer, of the pattern of the second touch electrode layer, and patterning the first insulation layer to form second opening regions corresponding to the quantum dot layers one to one; and forming first refractive index patterns in the second opening regions.

In some embodiments, before forming the pattern of the second touch electrode layer on the side, facing away from the first buffer layer, of the second refractive index layer, the method further includes:

forming a third refractive index layer on the side, facing away from the first buffer layer, of the second refractive index layer, where a refractive index of the third refractive index layer is smaller than the refractive index of the second refractive index layer.

In some embodiments, the quantum dot layers are in part of the first opening regions; and after forming the first pixel defining layer and the plurality of quantum dot layers on the sides, facing away from the first substrate, of the light emitting devices, the method further includes:

forming first filling layers in the first opening regions except for the first opening regions in which the quantum dot layers are arranged, where an orthographic projection of the first refractive index layer on the first substrate does not overlap orthographic projections of the first filling layers on the first substrate.

In some embodiments, after forming the first filling layers in the first opening regions except for the first opening regions in which the quantum dot layers are arranged, the method further includes:

forming a fifth refractive index layer on sides, facing away from the light emitting devices, of the first filling layers: where a refractive index of the first buffer layer is not equal to a refractive index of the fifth refractive index layer: the fifth refractive index layer includes second refractive index patterns corresponding to the first filling layers one to one: orthographic projections of the second refractive index patterns on the first substrate at least cover the orthographic projections of the first filling layers on the first substrate; and the orthographic projections of the second refractive index patterns do not overlap the orthographic projections of the quantum dot layers on the first substrate.

A display apparatus provided by an embodiment of the present disclosure includes the touch display panel provided by the embodiment of the present disclosure.

BRIEF DESCRIPTION OF THE DRAWINGS

In order to explain technical solutions in embodiments of the present disclosure more clearly, the following will briefly introduce accompanying drawings needed to be used in the description of the embodiments. Obviously, the accompanying drawings in the following description are only some embodiments of the present disclosure. For those of ordinary skill in the art, other accompanying drawings may further be obtained according to these accompanying drawings without paying creative labor.

DETAILED DESCRIPTION OF THE EMBODIMENTS

Figure 1:
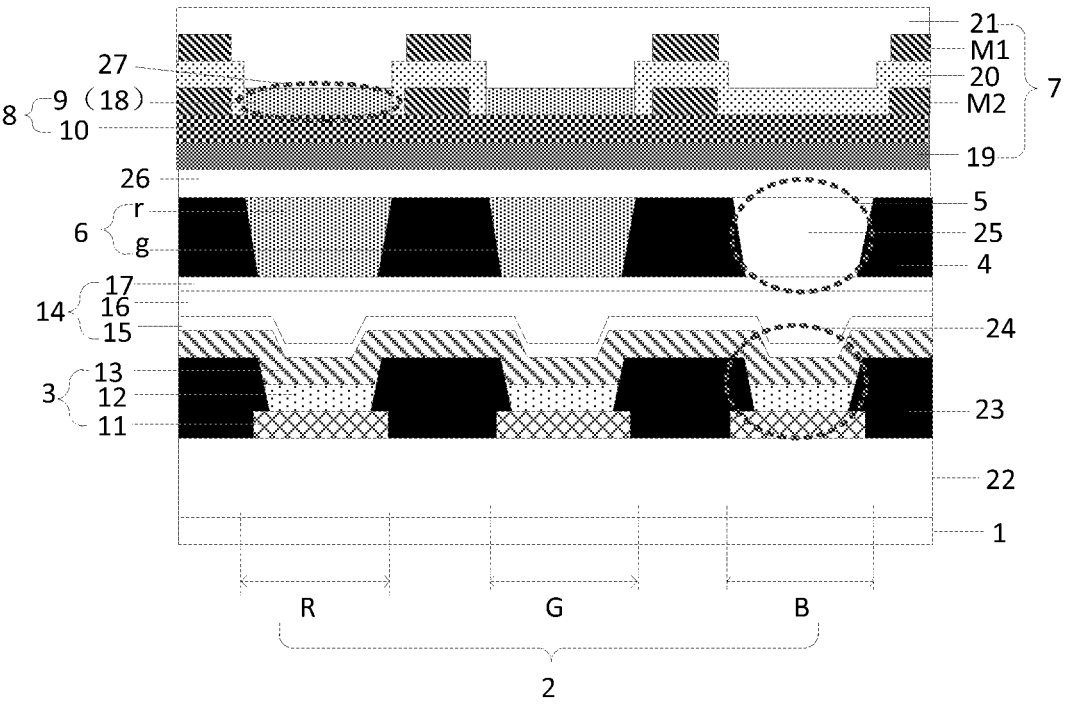
FIG. 1 is a schematic structural diagram of a touch display apparatus provided by an embodiment of the present disclosure.

In order to make objectives, technical solutions and advantages of embodiments of the present disclosure clearer, the technical solutions of the embodiments of the present disclosure will be clearly and completely described below in conjunction with accompanying drawings of the embodiments of the present disclosure. Apparently, the described embodiments are only a part of the embodiments of the present disclosure, not all of the embodiments. The embodiments in the present disclosure and features in the embodiments can be combined with each other in the case of not conflicting. Based on the described embodiments of the present disclosure, all other embodiments obtained by those ordinarily skilled in the art without creative work shall fall within the protection scope of the present disclosure.

Unless otherwise defined, technical or scientific terms used in the present disclosure shall have the ordinary meanings understood by those ordinarily skilled in the art to which the present disclosure pertains. The words "first", "second" and the similar words used in the present disclosure do not indicate any order, quantity or importance, but are merely used to distinguish different components. The words "comprise" or "include" and the like indicate that an element or item appearing before such the word covers listed elements or items appearing after the word and equivalents thereof, and does not exclude other elements or items. The words "connect" or "couple" or the like are not limited to physical or mechanical connection, but may include electrical connection, whether direct or indirect.

It needs to be noted that sizes and shapes of all figures in the accompanying drawings do not reflect true scales, and are only intended to schematically illustrate the content of the present disclosure. The same or similar reference numerals represent the same or similar elements or elements with the same or similar functions all the time.

Embodiments of the present disclosure provide a touch display panel, and as shown in FIG. 1, the touch display panel includes:

a first substrate 1, including a plurality of sub-pixel regions 2;

a plurality of light emitting devices 3, located on one side of the first substrate 1 and corresponding to the sub-pixel regions 2 one to one;

a first pixel defining layer 4, located on sides, facing away from the first substrate 1, of the light emitting devices 3, and including first opening regions 5 corresponding to the sub-pixel regions 2 one to one;

a plurality of quantum dot layers 6, located on the sides, facing away from the first substrate 1, of the light emitting devices 3, and located in at least part of the first opening regions 5;

a touch module 7, located on sides, facing away from the light emitting devices 3, of the quantum dot layers 6, and including a first touch electrode layer M1; and at least one layer of stacked insulation structure 8 which is located between the quantum dot layers 6 and the first touch electrode layer M1, and is for transmitting light emitted by each quantum dot layer 6 and reflecting light emitted by the light emitting devices 3: where the at least one layer of stacked insulation structure 8 includes a first refractive index layer 9 and a second refractive index layer 10 arranged on the whole layer: a refractive index of the first refractive index layer 9 is smaller than a refractive index of the second refractive index layer 10; the second refractive index layer 10 is located between the first refractive index layer 9 and the quantum dot layers 6: the first refractive index layer 9 includes a plurality of first refractive index patterns 18, and the first refractive index patterns 18 correspond to the quantum dot layers 6 one to one; and orthographic projections of the first refractive index patterns 18 on the first substrate 1 at least cover orthographic projections of the quantum dot layers 6 on the first substrate 1.

It should be noted that in the display panel provided by the embodiments of the present disclosure, the quantum dot layers are for absorbing the light emitted by the light emitting devices to radiate light of required color. Specifically, the color of the light radiated by the quantum dot layer is the same as the color of the sub-pixel region corresponding to the quantum dot layer.

The display panel provided by the embodiments of the present disclosure includes at least one layer of stacked insulation structure: the stacked insulation structure includes the second refractive index layer and the first refractive index layer which have different refractive indexes and are arranged on the sides, facing away from the light emitting devices, of the quantum dot layers in a laminated mode; and the refractive index of the second refractive index layer is greater than the refractive index of the first refractive index layer. The light interferes at an interface between the second refractive index layer and the first refractive index layer, so that a light reflectivity or transmittance within a specific wavelength range is increased. Therefore, by setting the refractive indexes of the first refractive index layer and the second refractive index layer, the light emitted by each quantum dot layer is emitted from the stacked insulation structure, the light emitted by the light emitting devices is reflected to be reused by the quantum dot layers, so that a utilization rate and a conversion rate of the light may be improved, and the front light output efficiency of the touch display panel is improved. Leakage of the light emitted by the light emitting devices may further be reduced, and the color purity of the display panel is improved. In a case of reducing the leakage of the light emitted by the light emitting devices and improving the color purity of the display panel, according to the touch display apparatus provided by the embodiments of the present disclosure, no color film needs to be arranged on light emitting sides of the quantum dot layers, a thickness of the touch display panel may be reduced, and a cost may further be saved. In addition, according to the display panel provided by the embodiments of the present disclosure, the touch module is located on one sides, facing away from the light emitting devices, of the quantum dot layers, so that a distance between the touch module and the light emitting devices may be increased, parasitic capacitances between the touch electrode layers in the touch module and cathodes of the light emitting devices are avoided, and a touch accuracy may be improved.

It should be noted that FIG. 1 takes a situation that only one layer of stacked insulation structure is arranged in the touch display panel as an example for illustration. During specific implementation, a plurality of layers of stacked insulation structures may also be arranged, and stacking of a plurality of layers of stacked insulation structure can also transmit the light emitted by each quantum dot layer and reflect the light emitted by the light emitting devices.

In some embodiments, as shown in FIG. 1, the touch module 7 further includes: a first buffer layer 19 located between the quantum dot layers 6 and the first touch electrode layer M1, a second touch electrode layer M2 located between the first touch electrode layer M1 and the first buffer layer 19, and a first insulation layer 20 located between the first touch electrode layer M1 and the second touch electrode layer M2:

the second refractive index layer 10 is located between the first buffer layer 19 and the second touch electrode layer M2; and the first insulation layer 20 includes second opening regions 27 corresponding to the quantum dot layers 6 one to one, and the first refractive index patterns 18 are located in the second opening regions 27.

That is, in the touch display panel provided by the embodiments of the present disclosure, the stacked insulation structure is arranged in the touch module, and moreover, the first refractive index patterns are located in the second opening regions, that is, the first refractive index patterns and the first insulation layer are located on the same film layer. In a case of arranging the stacked insulation structure, the first refractive index patterns and the first insulation layer are located on the same film layer, to avoid too much increase in the thickness of the touch module, and thus avoid too much increase in the thickness of the touch display panel.

In some embodiments, in a direction perpendicular to the first substrate, a thickness of each first refractive index pattern is equal to a thickness of the first insulation layer. In this way, the preparation difficulty of the first refractive index patterns may be reduced.

In some embodiments, as shown in FIG. 1, the touch module 7 further includes a first protective layer 21 located on one side, facing away from the first substrate, of the first touch electrode layer.

In some embodiments, a material of the first buffer layer includes silicon nitride ($SiN_x$).

During specific implementation, the thickness of the first buffer layer is greater than or equal to 0.2 micron and smaller than or equal to 0.4 micron.

In some embodiments, a material of the second refractive index layer includes silicon oxynitride ($SiNO_x$).

In some embodiments, when the material of the second refractive index layer includes $SiNO_x$, the refractive index of the second refractive index layer is greater than or equal to 1.65 and smaller than or equal to 1.75.

During specific implementation, a material of the first refractive index patterns may be an inorganic material. For example, the material of the first refractive index patterns includes silicon oxide ($SiO_x$).

In some embodiments, when the material of the first refractive index patterns includes $SiO_x$, the refractive index of each first refractive index pattern is greater than or equal to 1.45 and smaller than or equal to 1.55.

Of course, the material of the first refractive index patterns may also include aluminum oxide ($Al_2O_3$), magnesium fluoride ($MgF_2$), boron oxide ($B_2O_3$) and the like.

Alternatively, during specific implementation, the material of the first refractive index patterns may be an organic material. For example, the material of the first refractive index patterns includes one or a combination of the following: acrylic resin, polyurethane resin, silicone resin or epoxy resin.

In some embodiments, when the material of the first refractive index patterns includes one or a combination of the following: acrylic resin, polyurethane resin, silicone resin or epoxy resin, the refractive index of each first refractive index pattern is greater than or equal to 1.30 and smaller than or equal to 1.50.

In some embodiments, a thickness of the second refractive index layer is smaller than a thickness of each first refractive index pattern.

During specific implementation, the thickness of the second refractive index layer is greater than or equal to 0.1 micron and smaller than or equal to 0.2 micron. Whether the material of the first refractive index patterns is the inorganic material or the organic material, the thickness of each first refractive index pattern is greater than or equal to 0.2 micron and smaller than or equal to 0.4 micron.

Figure 2:
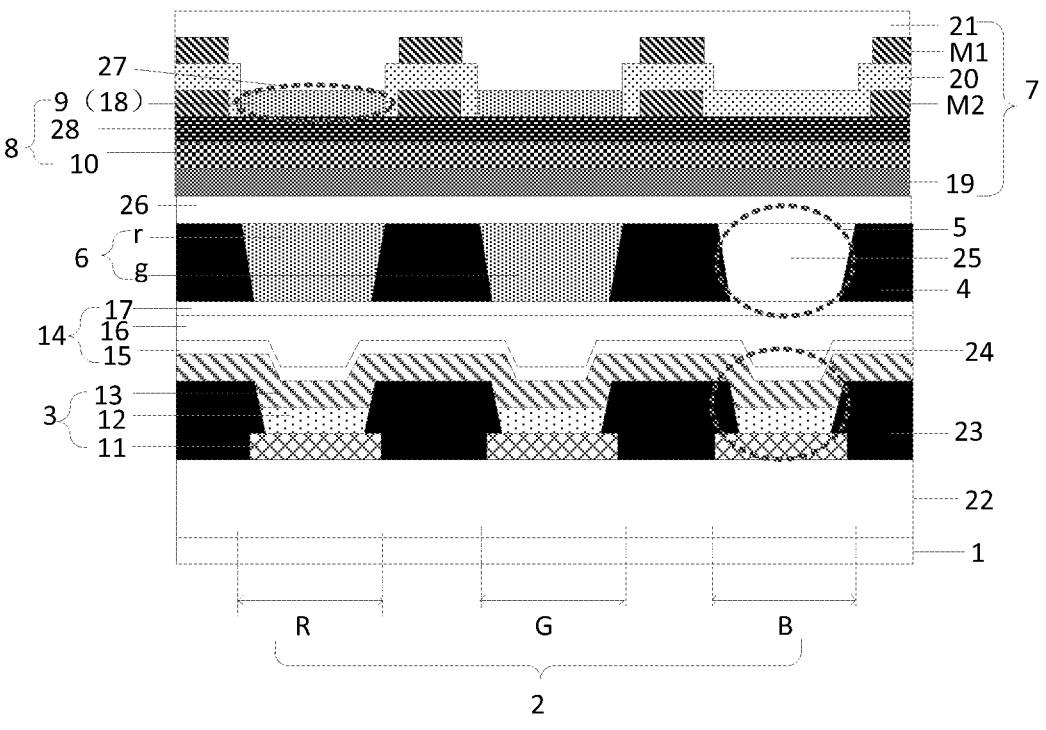
FIG. 2 is a schematic structural diagram of another touch display apparatus provided by an embodiment of the present disclosure.

In some embodiments, as shown in FIG. 2, the stacked insulation structure 8 further includes: a third refractive index layer 28, located between the first refractive index layer 9 and the second refractive index layer 10; where a refractive index of the third refractive index layer 28 is smaller than the refractive index of the second refractive index layer 10, and the refractive index of the third refractive index layer 28 is not equal to the refractive index of the first refractive index layer 9.

In the display apparatus provided by the embodiments of the present disclosure, the stacked insulation structure further includes the third refractive index layer located between the first refractive index layer and the second refractive index layer, the refractive index of the third refractive index layer is smaller than the refractive index of the second refractive index layer, and the refractive index of the third refractive index layer is not equal to the refractive index of the first refractive index layer. The light interferes at an interface between the second refractive index layer and the third refractive index layer and an interface between the third refractive index layer and the first refractive index layer, which may more easily increase a light reflectivity or transmittance within a specific wavelength range, so as to more easily realize that the light emitted by each quantum dot layer is emitted from the stacked insulation structure, and the light emitted by the light emitting devices is reflected, so that more light emitted by the light emitting devices is reflected to be reused by the quantum dot layers, which may further improve the utilization rate and the conversion rate of the light, improve the front light output efficiency of the touch display panel and improve the color purity of the touch display panel.

In some embodiments, the third refractive index layer includes an organic matrix.

In some embodiments, a material of the organic matrix includes one or a combination of the following: silane resin or epoxy resin.

In some embodiments, the refractive index of the third refractive index layer is greater than or equal to 1.45 and smaller than or equal to 1.60.

In some embodiments, the refractive index of the third refractive index layer is smaller than the refractive index of the first refractive index layer.

In some embodiments, the refractive index of the third refractive index layer is greater than or equal to 1.25 and smaller than or equal to 1.45.

In some embodiments, the third refractive index layer further includes hollow particles dispersed in the organic matrix. That is, in the touch display panel provided by the embodiments of the present disclosure, the third refractive index layer is composed of the organic matrix and the hollow particles dispersed in the organic matrix; and the hollow particles are added in the organic matrix, which may reduce a refractive index of the whole film layer, so as to more easily realize that the refractive index of the third refractive index layer is smaller than the refractive index of the second refractive index layer, and the refractive index of the third refractive index layer is not equal to the refractive index of the first refractive index layer.

In some embodiments, the hollow particles are a core-shell structure, a material of the shell includes silicon oxide, and the part of the core wrapped by the shell is air. During specific implementation, a mass percentage of the hollow particles in the organic matrix is greater than or equal to 40% and smaller than or equal to 70%.

During specific implementation, a thickness of the third refractive index layer is greater than or equal to 0.1 micron and smaller than or equal to 0.2 micron.

In some embodiments, as shown in FIG. 1 and FIG. 2, the quantum dot layers 6 are located in part of the first opening regions 5;

the touch display panel further includes: a plurality of first filling layers 25, located in the first opening regions 5 except for the first opening regions 5 in which the quantum dot layers 6 are arranged; and an orthographic projection of the first refractive index layer 9 on the first substrate 1 does not overlap orthographic projections of the first filling layers 25 on the first substrate 1.

That is, the first opening regions that are not provided with the quantum dot layers are filled with the first filling layers. During specific implementation, the first filling layers are light transmission film layers, and the sub-pixel colors corresponding to the first filling layers are the light-emitting colors of the light emitting devices.

Figure 3:
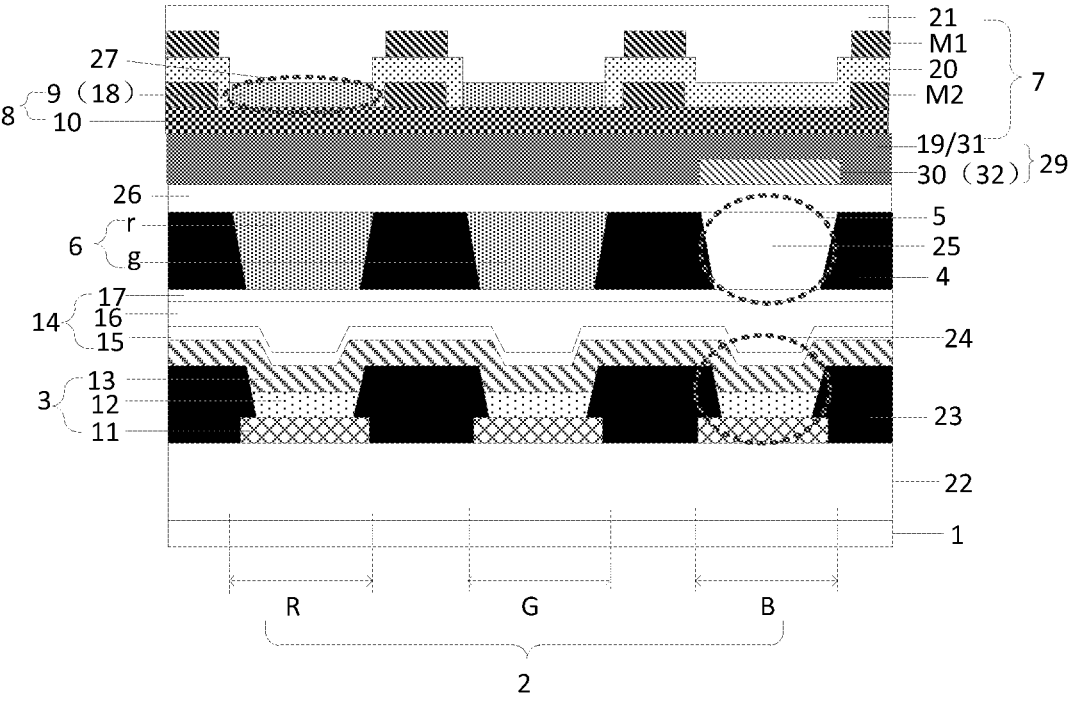
FIG. 3 is a schematic structural diagram of another touch display apparatus provided by an embodiment of the present disclosure.
Figure 4:
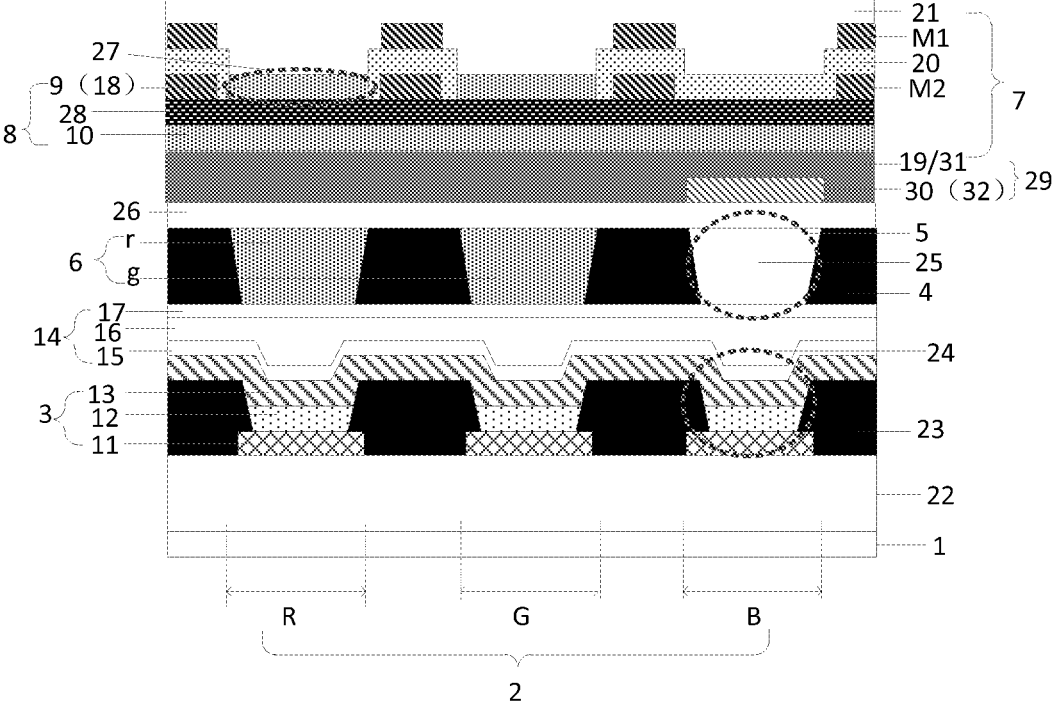
FIG. 4 is a schematic structural diagram of another touch display apparatus provided by an embodiment of the present disclosure.

In some embodiments, as shown in FIG. 3 and FIG. 4, the touch display panel further includes: a first light transmission structure 29 which is located between the first filling layers 25 and the first touch electrode layer M1 and is for transmitting light emitted by the light emitting devices 3:

the first light transmission structure 29 includes: a fourth refractive index layer 31, and a fifth refractive index layer 30 located between the fourth refractive index layer 31 and the first filling layers 25: a refractive index of the fourth refractive index layer 31 is not equal to a refractive index of the fifth refractive index layer 30; the fifth refractive index layer 30 includes second refractive index patterns 32 corresponding to the first filling layers 25 one to one; orthographic projections of the second refractive index patterns 32 on the first substrate 1 at least cover the orthographic projections of the first filling layers 25 on the first substrate 1; and the orthographic projections of the second refractive index patterns 32 on the first substrate 1 do not overlap the orthographic projections of the quantum dot layers 6 on the first substrate 1.

According to the touch display apparatus provided by the embodiments of the present disclosure, the first light transmission structure is arranged between the first filling layers and the first touch electrode layer: the first light transmission structure includes the fourth refractive index layer and the fifth refractive index layer with different refractive indexes: the light interferes at an interface between the fourth refractive index layer and the fifth refractive index layer; and the refractive indexes of the fourth refractive index layer and the fifth refractive index layer are adjusted, so as to increase the transmittance of the light emitted by the light emitting devices.

In some embodiments, as shown in FIG. 3 and FIG. 4, when the touch module 7 includes the first buffer layer 19, the first buffer layer 19 is multiplexed as the fourth refractive index layer 31. Therefore, while the first light transmission structure for increasing the transmittance of the light emitted by the light emitting devices is arranged, too much increase in the thickness of the touch module may be avoided as much as possible, and thus too much increase in the thickness of the touch display panel may be avoided. In addition, the first buffer layer covers the second refractive index patterns, which may ensure the insulativity and a water-oxygen barrier effect.

In some embodiments, a material of the fifth refractive index layer is an inorganic material. The inorganic material is, for example. $SiO_x$, and the refractive index of the $SiO_x$ is greater than or equal to 1.45 and smaller than or equal to 1.55. Of course, the inorganic material may also be $Al_2O_3$. $MgF_2$. $B_2O_3$ and the like.

In some embodiments, a thickness of the fifth refractive index layer is greater than or equal to 0.05 micron and smaller than or equal to 0.1 micron.

In some embodiments, as shown in FIG. 1 to FIG. 4, the orthographic projection of the second refractive index layer 10 on the first substrate 1 covers the orthographic projections of the first filling layers 25 on the first substrate 1.

In some embodiments, as shown in FIG. 2 and FIG. 4, when the touch display panel further includes the third refractive index layer 28, the orthographic projection of the third refractive index layer 28 on the first substrate 1 covers the orthographic projections of the first filling layers 25 on the first substrate.

That is, both the second refractive index layer and the third refractive index layer may extend to cover regions corresponding to the first filling layers, and both the second refractive index layer and the third refractive index layer may be arranged on the whole layer. Since the first refractive index patterns are not arranged in the regions corresponding to the first filling layers, thus in the regions corresponding to the first filling layers, the second refractive index layer and the third refractive index layer may not affect the light emitted by the light emitting devices.

In some embodiments, as shown in FIG. 1 to FIG. 4, the plurality of sub-pixel regions 2 include: a plurality of red sub-pixel regions R, a plurality of blue sub-pixel regions B and a plurality of green sub-pixel regions G.

In some embodiments, the plurality of light emitting devices are blue light emitting devices. As shown in FIG. 1 to FIG. 4, the quantum dot layers 6 are only located in the first opening regions 5 corresponding to the red sub-pixel regions R and the green sub-pixel regions G.

Specifically, as shown in FIG. 1 to FIG. 4, the red-light quantum dot layer r is arranged in the first opening region 5 corresponding to the red sub-pixel region R, and the red-light quantum dot layer r absorbs blue light and radiates red light; and the green-light quantum dot layer g is arranged in the first opening region 5 corresponding to the green sub-pixel region G. and the green-light quantum dot layer g absorbs the blue light and radiates green light. Since the light emitting devices are the blue light emitting devices, the blue sub-pixel regions B may also make the touch display panel realize full-color display without arranging quantum dot layers.

During specific implementation, a material of the quantum dot layers includes a core-shell quantum dot structure; and a core material in the core-shell quantum dot structure may be, for example, cadmium selenide (CdSe) and indium phosphide (InP), and a shell material in the core-shell quantum dot structure may be zinc sulfide (ZnS).

During specific implementation, as shown in FIG. 1 to FIG. 4, the first filling layers 25 are located in the first opening regions 5 corresponding to the blue sub-pixel regions B.

During specific implementation, the first filling layers and the first pixel defining layer may include resin materials. The first pixel defining layer includes light-shielded resin materials, and the filling layers include light-transmitted resin materials.

In some embodiments, as shown in FIG. 1 to FIG. 4, orthographic projections of the first touch electrode layer M1 and the second touch electrode layer M2 on the first substrate 1 do not overlap the orthographic projections of the first opening regions 5 on the first substrate 1.

Therefore, the first touch electrode layer M1 and the second touch electrode layer M2 may not affect light emitting of the sub-pixels, and normal display of a touch display substrate is prevented from being affected.

Figure 5:
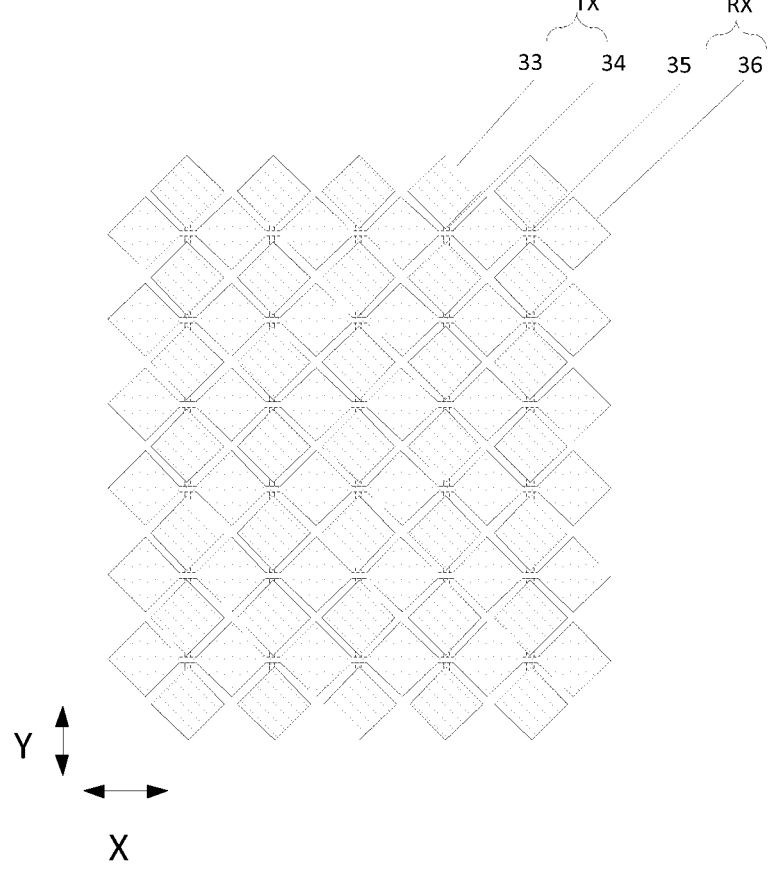
FIG. 5 is a schematic structural diagram of another touch display apparatus provided by an embodiment of the present disclosure.
Figures 6, 7:
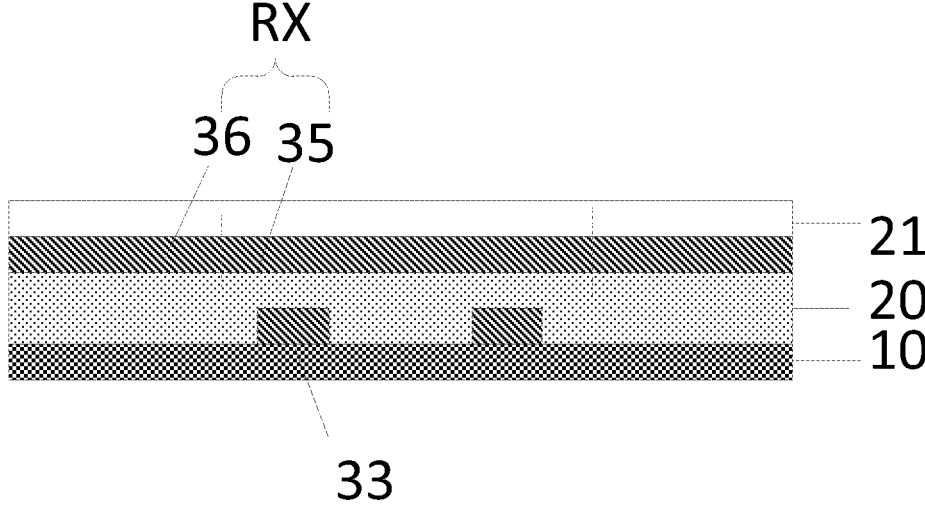
FIG. 6 is a schematic structural diagram of another touch display apparatus provided by an embodiment of the present disclosure.
FIG. 7 is a schematic structural diagram of another touch display apparatus provided by an embodiment of the present disclosure.

In some embodiments, the first touch electrode layer and the second touch electrode layer include a plurality of touch electrodes. During specific implementation, as shown in FIG. 5. FIG. 6 and FIG. 7, the touch electrodes include a plurality of touch sensing electrodes RX and a plurality of touch driving electrodes TX which are intersected with one another: each touch sensing electrode RX includes: a plurality of touch sensing sub-electrodes 36 and connection portions 35 for connecting the adjacent touch sensing sub-electrodes 36; and each touch driving electrode TX includes: a plurality of touch driving sub-electrodes 33 and bridging electrodes 34 for connecting the adjacent touch driving sub-electrodes 33. During specific implementation, the touch sensing sub-electrodes 36 and the connection portions 35 are integrally connected; and the touch sensing sub-electrodes 36, the connection portions 35 and the touch driving sub-electrodes 33 are arranged on the same layer.

In some embodiments, in FIG. 5, the touch sensing electrodes RX extend in a first direction X, the touch driving electrodes TX extend in a second direction Y, and the first direction X intersects with the second direction Y, for example, the first direction X is perpendicular to the second direction Y. Of course, during specific implementation, positions of the touch sensing electrodes RX and positions of the touch driving electrodes TX may be interchanged.

It should be noted that FIG. 5 takes a situation that an outline of each touch sensing sub-electrode and an outline of each touch driving sub-electrode are rhombic as an example for illustration. During specific implementation, in order to realize that the orthographic projections of the first touch electrode layer and the second touch electrode layer on the first substrate do not overlap the orthographic projections of the first opening regions on the first substrate, as shown in FIG. 8 to FIG. 10, the touch driving electrodes and the touch sensing electrodes are all grid electrodes 37.

Figure 8:
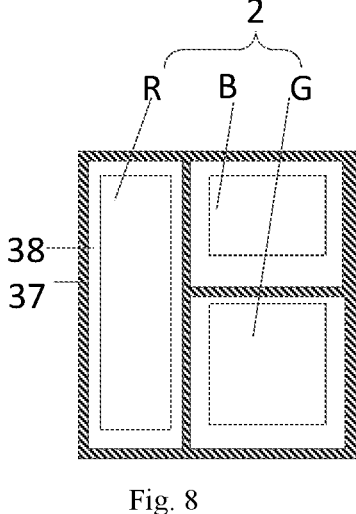
FIG. 8 is a schematic structural diagram of a grid electrode provided by an embodiment of the present disclosure.
Figure 9:
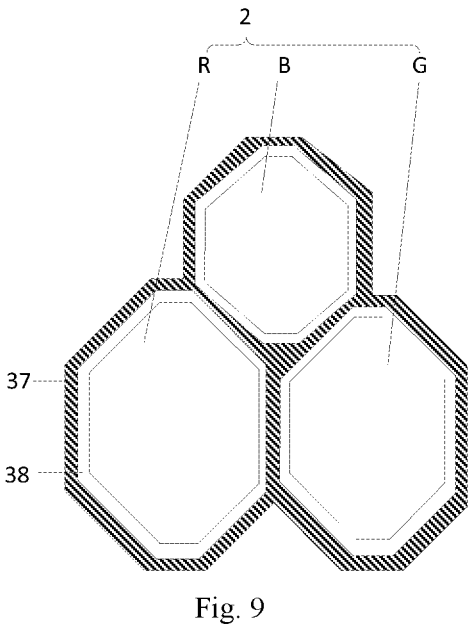
FIG. 9 is a schematic structural diagram of another grid electrode provided by an embodiment of the present disclosure.
Figure 10:
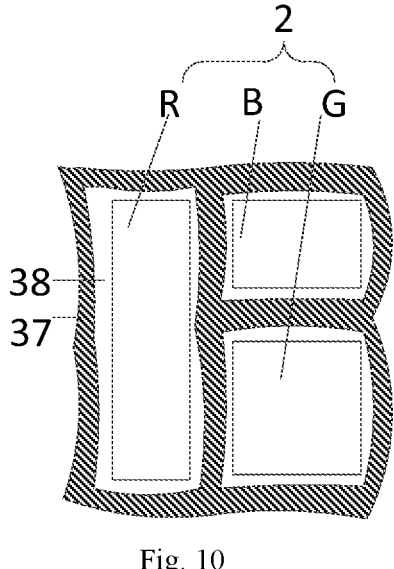
FIG. 10 is a schematic structural diagram of another grid electrode provided by an embodiment of the present disclosure.

In some embodiments, a touch region of the touch display panel coincides with the display region, when the touch driving electrodes and the touch sensing electrodes are all grid electrodes 37, as shown in FIG. 8 to FIG. 10, the grid electrodes 37 include a plurality of holes 38. For example, orthographic projections of the holes 38 on the first substrate correspond to orthographic projections of the sub-pixels 2 on the first substrate one to one. In some embodiments, the orthographic projections of the first opening regions on the first substrate fall into the orthographic projections of the holes 38 on the first substrate. In this way, the touch driving electrodes and the touch sensing electrodes may be prevented from affecting the light output of the sub-pixels, and normal display of the touch display substrate is prevented from being affected.

It should be noted that FIG. 8 to FIG. 10 show sub-pixel arrangement modes respectively. In FIG. 8 to FIG. 10, only the region corresponding to one pixel is shown, that is, one pixel includes three sub-pixels; and the three sub-pixels are respectively a red sub-pixel R, a green sub-pixel G and a blue sub-pixel B. An area of a light emitting region of the red sub-pixel R is greater than an area of a light emitting region of the green sub-pixel G, and the area of the light emitting region of the green sub-pixel G is greater than an area of a light emitting region of the blue sub-pixel B. In FIG. 8 and FIG. 10, the red sub-pixel R, the green sub-pixel G and the blue sub-pixel B are arranged in a rectangle; and in FIG. 9, the red sub-pixel R, the green sub-pixel G and the blue sub-pixel B are arranged in a triangle. In FIG. 8, shapes of the light emitting regions of the red sub-pixel R, the green sub-pixel G and the blue sub-pixel B are all quadrangles, and shapes of the holes 38 are quadrangles. In FIG. 9, shapes of the light emitting regions of the red sub-pixel R, the green sub-pixel G and the blue sub-pixel B are octagons; and correspondingly, the shapes of the holes 38 are octagons. In FIG. 10, shapes of the light emitting regions of the red sub-pixel R, the green sub-pixel G and the blue sub-pixel B are approximately quadrangles; and the shapes of the holes 38 are approximate quadrangles, for example, the shapes of the holes 38 are quadrangles with curve edges. During specific implementation, in FIG. 8 and FIG. 9, grids in the grid electrodes are linear; and in FIG. 10, the grids in the grid electrodes are curved.

During specific implementation, materials of the first touch electrode layer and the second touch electrode layer include a titanium/aluminum/titanium lamination; and a material of the first protective layer includes polyimide (PI).

During specific implementation, in the titanium/aluminum/titanium lamination, a thickness of titanium is, for example, greater than or equal to 30 nanometers (nm) and smaller than or equal to 50 nm; and a thickness of aluminum is, for example, greater than or equal to 100 nm and smaller than or equal to 300 nm. The thickness of the first insulation layer is, for example, greater than or equal to 0.2 micron and smaller than or equal to 0.4 micron. The thickness of the first protective layer is, for example, greater than or equal to 1 micron and smaller than or equal to 2 microns.

In some embodiments, the light emitting devices are electroluminescent devices. The electroluminescent devices are, for example, organic light emitting diode devices. Alternatively, the electroluminescent devices may also be micro light emitting diodes (Micro LEDs). Mini LEDs and other light emitting devices.

Next, the light emitting devices being OLEDs is taken as an example for illustration.

In some embodiments, as shown in FIG. 1 to FIG. 4, the touch display panel further includes: a driving circuit layer 22 located between the first substrate 1 and the light emitting devices 3, a second pixel defining layer 23 located between the driving circuit layer 22 and the first pixel defining layer 4, an encapsulation layer 14 located between the light emitting devices 3 and the first pixel defining layer 4, and a first planarization layer 26 located between the first pixel defining layer 4 and the first buffer layer 19. The second pixel defining layer 23 includes third opening regions 24 corresponding to the sub-pixel regions 2 one to one; and each of the light emitting devices 3 includes an anode 11, a light emitting function layer 12 and a cathode 13 which are sequentially arranged in the third opening regions 24 in a laminated mode, where the anodes 11 are located between the second pixel defining layer 23 and the driving circuit layer 22, the second pixel defining layer 23 covers edges of the anodes 11, and the cathodes 13 corresponding to the plurality of sub-pixel regions 2 are integrally connected. In some embodiments, the display panel may further include a light extracting layer located between the cathodes and the encapsulation layer.

Figure 11:
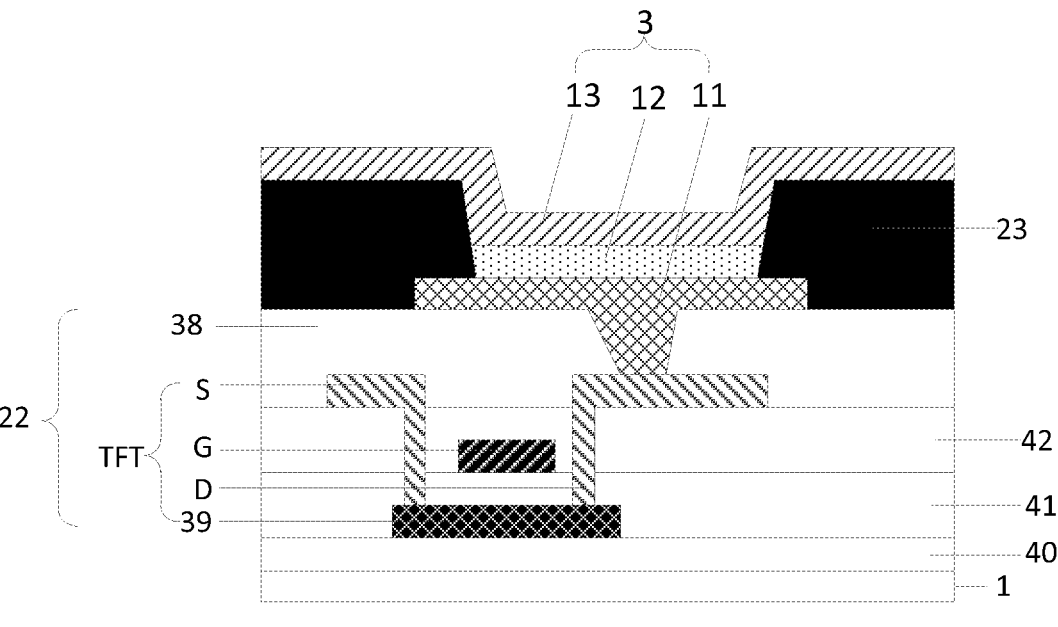
FIG. 11 is a schematic structural diagram of another touch display apparatus provided by an embodiment of the present disclosure.

During specific implementation, the driving circuit layer includes a plurality of pixel driving circuits arranged in an array; and the pixel driving circuits are used for driving the light emitting devices to emit light. As shown in FIG. 11, each pixel driving circuit includes a thin film transistor TFT and a storage capacitor (not shown); and the thin film transistor TFT includes: an active layer 39, a gate G, a source S and a drain D. FIG. 11 takes the thin film transistor TFT being a top-gate structure as an example for illustration, and of course, the thin film transistor TFT may also be a bottom-gate structure or other structures. As shown in FIG. 11, the display substrate further includes: a second buffer layer 40 located between the first substrate 1 and the active layer 39; the driving circuit layer 22 further includes: a first gate insulation layer 41 located between the active layer 39 and the gate G, an interlayer insulation layer 42 located between the first gate insulation layer 41 and the source S and drain D, and a second planarization layer 38 located between the light emitting devices 3 and the source S and drain D. The anode 11 is connected with the drain D through a via hole penetrating through the second planarization layer 38.

During specific implementation, the light emitting function layer includes an organic light emitting layer, and may further include an electron injection layer, an electron transfer layer, a hole transfer layer, a hole injection layer and the like.

During specific implementation, when the light emitting devices are the blue light emitting devices, the organic light emitting layers corresponding to all sub-pixel regions emit blue light, but light emitting spectra of the organic light emitting layers corresponding to all sub-pixel regions may be the same or different.

In some embodiments, as shown in FIG. 1 to FIG. 4, the encapsulation layer 14 includes: a first inorganic encapsulation film 15, an organic encapsulation film 16 and a second inorganic encapsulation film 17 which are arranged in a laminated mode.

Figure 12:
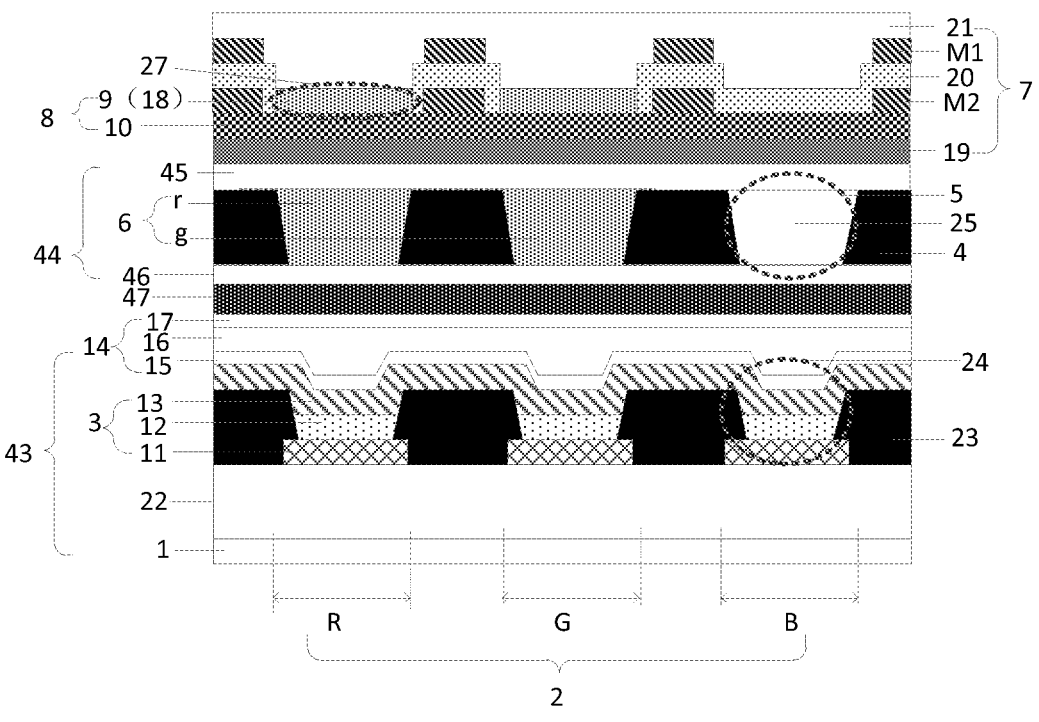
FIG. 12 is a schematic structural diagram of another touch display apparatus provided by an embodiment of the present disclosure.

It should be noted that FIG. 1 to FIG. 4 take a situation that the quantum dot layers and the first pixel defining layer are directly prepared on the encapsulation layer 14 as an example for illustration. During specific implementation, as shown in FIG. 12, a display substrate 43 including the light emitting devices 3 and a color conversion substrate 44 including the quantum dot layers 6 and the first pixel defining layer 4 may be prepared separately, and then the display substrate and the color conversion substrate are bonded through a box aligning process. As shown in FIG. 12, the color conversion substrate 44 further includes a second substrate 45 and a cover layer 46: the second substrate 45 is located on one sides, facing away from the encapsulation layer 14, of the quantum dot layers 6; and the cover layer 46 is located between the quantum dot layers 6 and the encapsulation layer 14. The touch display apparatus further includes a bonding layer 47 located between the display substrate 43 and the color conversion substrate 44. During specific implementation, for the solution of bonding the display substrate and the color conversion substrate through the box aligning process, the first buffer layer 19 is located on one side, facing away from the quantum dot layers 6, of the second substrate 45.

Next, the situation that the plurality of light emitting devices are the blue light emitting devices, and the quantum dot layers are only located in the first opening regions corresponding to the red sub-pixel regions and the green sub-pixel regions is taken as an example, as shown in Table quantum dot layers again to emit light. Therefore, compared with the touch display panel a that is not provided with the stacked insulation structure, the color purity and color gamut of the touch display panels b, c, d and e provided by the embodiments of the present disclosure are greatly improved: in addition, the blue light that is not used is reflected to excite the quantum dot layers again to emit light, so that the conversion rate of the quantum dot layers is improved, and the light effects R_Eff, G_Eff and W_Eff are all improved. The color gamut of the touch display panels b, c, d and e provided by the embodiment of the present disclosure are gradually improved. In addition, since the touch display panel e is further provided with the first light transmission structure for improving the blue-light transmission, the blue light effect B_Eff may be improved.

TABLE 1

|   | Rx | Ry | R_Eff | Gx | Gy | G_Eff | Bx | By | B_Eff | W_Eff | BT2020 color gamut |
|---|------|------|------|-------|-------|------|-------|-------|------|------|------|
| a | 0.661 | 0.297 | 100% | 0.189 | 0.686 | 100% | 0.141 | 0.047 | 100% | 100% | 75% |
| b | 0.670 | 0.294 | 103% | 0.160 | 0.737 | 105% | 0.141 | 0.047 | 99% | 106% | 85% |
| c | 0.684 | 0.316 | 104% | 0.187 | 0.775 | 107% | 0.141 | 0.047 | 99% | 108% | 90% |
| d | 0.696 | 0.306 | 105% | 0.180 | 0.775 | 108% | 0.141 | 0.047 | 99% | 110% | 93% |
| e | 0.696 | 0.306 | 105% | 0.180 | 0.775 | 108% | 0.141 | 0.048 | 103% | 112% | 93.2% |

Figure 13:
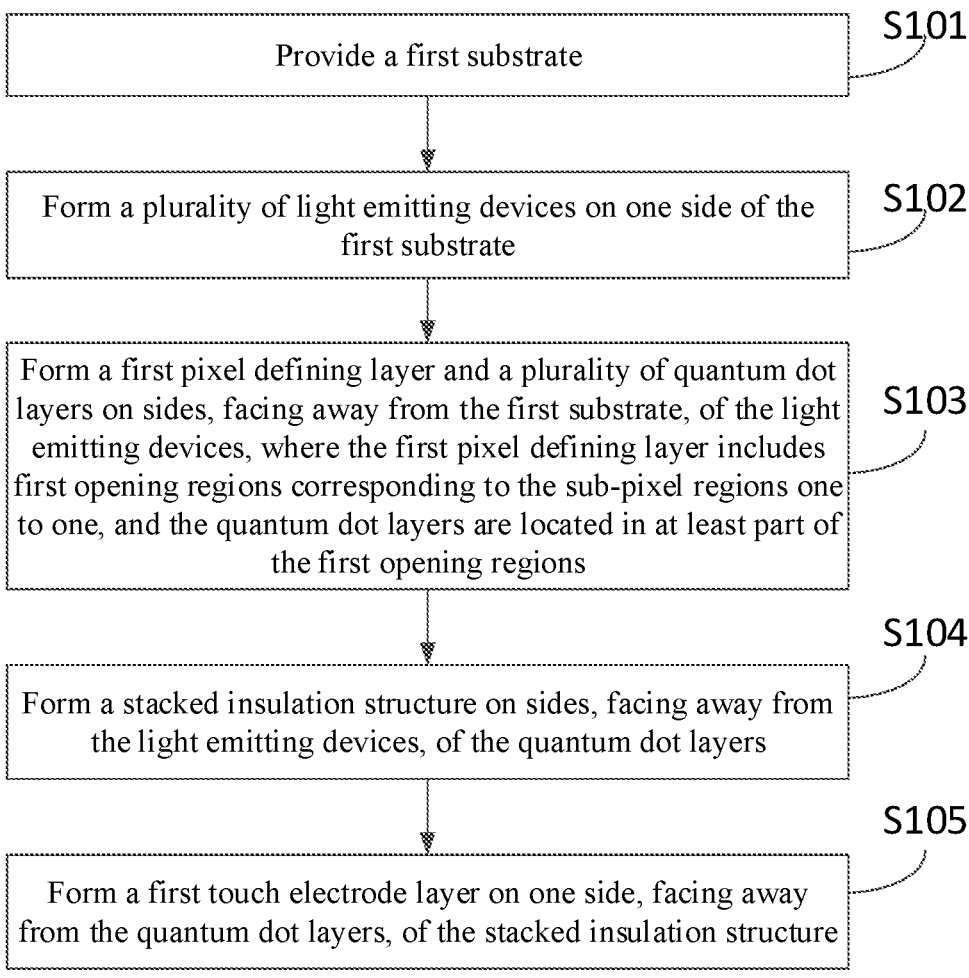
FIG. 13 is a schematic flow chart of a preparation method of a touch display apparatus provided by an embodiment of the present disclosure.

1, simulation results of the touch display panels a, b, c, d and e are introduced. The touch display panel a is a panel that does not include the stacked insulation structure and the first light transmission structure, that is, the touch module only includes the first buffer layer, the second touch electrode layer, the first insulation layer, the first touch electrode layer and the first protective layer which are sequentially arranged in a stacked mode. A structure of the touch display panel b is as shown in FIG. 1, structures of the touch display panels c and d are as shown in FIG. 2, and a structure of the touch display panel e is as shown in FIG. 4. In the touch display panels b, c, d and e, the material of the first buffer layer is SiN$_x$, and a thickness of SiN$_x$ is greater than or equal to 0.2 micron and smaller than or equal to 0.4 micron: the material of the first refractive index layer is SiO$_x$, a refractive index of SiO$_x$ is greater than or equal to 1.45 and smaller than or equal to 1.55 micron, and a thickness of SiO$_x$ is greater than or equal to 0.2 micron and smaller than or equal to 0.4 micron; and the material of the second refractive index layer is SiNO$_x$, a refractive index of SiNO$_x$ is greater than or equal to 1.65 and smaller than or equal to 1.75, and a thickness of SiNO$_x$ is greater than or equal to 0.1 micron and smaller than or equal to 0.2 micron. In the touch display panels b and c, the material of the organic matrix included in the third refractive index layer is silane resin or epoxy resin: the refractive index of the third refractive index layer in the touch display panel b is greater than or equal to 1.45 and smaller than or equal to 1.60; the refractive index of the third refractive index layer in the touch display panel c is greater than or equal to 1.25 and smaller than or equal to 1.45; and in the touch display panel e, the material of the fifth refractive index layer is SiO$_x$, a refractive index of SiO$_x$ is greater than or equal to 1.45 and smaller than or equal to 1.55, and a thickness of SiO$_x$ is greater than or equal to 0.05 micron and smaller than or equal to 0.1 micron. In Table 1, Rx, Ry, Gx, Gy, Bx and By represent color coordinates; and R_Eff, G_Eff, B_Eff and W_Eff represent light effects. According to Table 1, since the stacked insulation structure is arranged in the embodiments of the present disclosure, blue light that is not used may be reflected to excite the Based on the same inventive concept, embodiments of the present disclosure further provide a preparation method of a touch display panel, as shown in FIG. 13, including:

S101, providing a first substrate, where the first substrate includes a plurality of sub-pixel regions.

S102, forming a plurality of light emitting devices on one side of the first substrate, where the light emitting devices correspond to the sub-pixel regions one to one.

S103, forming a first pixel defining layer and a plurality of quantum dot layers on sides, facing away from the first substrate, of the light emitting devices, where the first pixel defining layer includes first opening regions corresponding to the sub-pixel regions one to one, and the quantum dot layers are located in at least part of the first opening regions;

S104, forming a stacked insulation structure on sides, facing away from the light emitting devices, of the quantum dot layers, where the stacked insulation structure includes at least one group of a first refractive index layer and second refractive index layer on the whole layer in a laminated mode, a refractive index of the first refractive index layer is smaller than a refractive index of the second refractive index layer, the second refractive index layer is located between the first refractive index layer and the quantum dot layers, the first refractive index layer includes a plurality of first refractive index patterns which correspond to the quantum dot layers one to one, and orthographic projections of the first refractive index patterns on the first substrate at least cover orthographic projections of the quantum dot layers on the first substrate; and S105, forming a first touch electrode layer on one side, facing away from the quantum dot layers, of the stacked insulation structure.

According to the preparation method of the touch display panel provided by the embodiments of the present disclosure, at least one layer of stacked insulation structure is formed on the sides, facing away from the light emitting devices, of the quantum dot layers: the stacked insulation structure includes the second refractive index layer and the first refractive index layer which have different refractive indexes and are arranged on the sides, facing away from the light emitting devices, of the quantum dot layers in a laminated mode; and the refractive index of the second refractive index layer is greater than the refractive index of the first refractive index layer. The light interferes at an interface between the second refractive index layer and the first refractive index layer, so that a light reflectivity or transmittance within a specific wavelength range is increased. Therefore, by setting the refractive indexes of the first refractive index layer and the second refractive index layer, the light emitted by each quantum dot layer is emitted from the stacked insulation structure, the light emitted by the light emitting devices is reflected to be reused by the quantum dot layers, so that a utilization rate and a conversion rate of the light may be improved, and the front light output efficiency of the touch display panel is improved. Leakage of the light emitted by the light emitting devices may further be reduced, and the color purity of the display panel is improved. In a case of reducing the leakage of the light emitted by the light emitting devices and improving the color purity of the display panel, no color film needs to be formed on light emitting sides of the quantum dot layers, a thickness of the touch display panel may be reduced, a process flow may further be saved, and a cost may further be saved. In addition, since the touch module is located on the sides, facing away from the light emitting devices, of the quantum dot layers, a distance between the touch module and the light emitting devices may be increased, parasitic capacitances between the touch electrode layers in the touch module and cathodes of the light emitting devices are avoided, and a touch accuracy may be improved.

In some embodiments, before forming the plurality of light emitting devices on one side of the first substrate, the method further includes:

forming patterns of a second buffer layer, an active layer, a first gate insulation layer, a gate, an interlayer insulation layer, a source and drain, and a second planarization layer sequentially on one side of the first substrate.

The forming the plurality of light emitting devices on one side of the first substrate specific includes:

forming patterns of a plurality of anodes on one side, facing away from the first substrate, of the second planarization layer;

forming a second pixel defining layer on one sides, facing away from the second planarization layer, of the anodes, and patterning the second pixel defining layer to form third opening regions corresponding to the anodes one to one, where the third opening regions expose the anodes;

forming a pattern of a light emitting function layer in the third opening regions; and forming cathodes on one side, facing away from the anodes, of the light emitting function layer.

After forming the plurality of light emitting devices on one side of the first substrate, the method further includes:

forming a first inorganic encapsulation film, an organic encapsulation film and a second inorganic encapsulation film sequentially on sides, facing away from the light emitting function layer, of the cathodes.

In some embodiments, the forming the first pixel defining layer and the plurality of quantum dot layers on the sides, facing away from the first substrate, of the light emitting devices, specifically includes:

forming the first pixel defining layer on one side, facing away from the organic encapsulation film, of the second inorganic encapsulation film, and patterning the first pixel defining layer to form the plurality of first opening regions; and forming the quantum dot layers in at least part of the first opening regions.

In some embodiments, after forming the quantum dot layers in the at least part of the first opening regions, the method further includes:

forming a first planarization layer which covers the quantum dot layers and the first pixel defining layer.

Alternatively, in some embodiments, the forming the first pixel defining layer and the plurality of quantum dot layers on the sides, facing away from the first substrate, of the light emitting devices, specifically includes:

providing a second substrate, forming the first pixel defining layer on one side of the second substrate, and patterning the first pixel defining layer to form the plurality of first opening regions;

forming the quantum dot layers in at least part of the first opening regions;

forming a cover layer which covers the quantum dot layers and the first pixel defining layer to obtain a color conversion substrate; and bonding the color conversion substrate with a display substrate including the light emitting devices by adopting a box aligning process.

Specifically, for example, the cover layer is bonded with an encapsulation layer through a bonding layer, so that the color conversion substrate is bonded with the display substrate including the light emitting devices.

In some embodiments, before forming the stacked insulation structure on the sides, facing away from the light emitting devices, of the quantum dot layers, the method further includes:

forming a first buffer layer on the sides, facing away from the light emitting devices, of the quantum dot layers.

The forming the stacked insulation structure on the sides, facing away from the light emitting devices, of the quantum dot layers, specifically includes:

forming a second refractive index layer on one side, facing away from the quantum dot layers, of the first buffer layer;

forming a pattern of a second touch electrode layer on one side, facing away from the first buffer layer, of the second refractive index layer;

forming a first insulation layer on one side, facing away from the second refractive index layer, of the pattern of the second touch electrode layer, and patterning the first insulation layer to form second opening regions which correspond to the quantum dot layers one to one; and forming first refractive index patterns in the second opening regions.

During specific implementation, for example. $SiN_x$ is deposited by adopting a plasma enhanced chemical vapor deposition (PECVD) process to form the first buffer layer.

During specific implementation, for example, $SiNO_x$ is deposited by adopting the PECVD process to form the second refractive index layer.

During specific implementation, for example, when the pattern of the first touch electrode layer and the pattern of the second touch electrode layer are formed, titanium/aluminum/titanium may be formed sequentially by adopting a sputtering process.

During specific implementation, for example. $SiN_x$ is deposited by adopting the PECVD process to form the first insulation layer; and then the exposure, development, etching and other patterning processes are performed on the first insulation layer to form the second opening regions.

During specific implementation, when the material included in the first refractive index patterns is an inorganic material, for example, the first refractive index patterns may be formed in the second opening regions by adopting the PECVD process in combination with a metal mask technology. When the material included in the first refractive index patterns is an organic material, for example, the first refractive index patterns may be formed in the second opening regions by adopting an inkjet printing process in combination with the metal mask technology.

In some embodiments, after forming the first touch electrode layer on the side, facing away from the quantum dot layers, of the stacked insulation structure, the method further includes:

forming a first protective layer on one side, facing away from the first substrate, of the first touch electrode layer.

In some embodiments, before forming the pattern of the second touch electrode layer on the side, facing away from the first buffer layer, of the second refractive index layer, the method further includes:

forming a third refractive index layer on the side, facing away from the first buffer layer, of the second refractive index layer, where a refractive index of the third refractive index layer is smaller than the refractive index of the second refractive index layer.

During specific implementation, for example, one side, facing away from the first buffer layer, of the second refractive index layer is spin-coated with the organic material to form the third refractive index layer. The organic material may be silane resin, epoxy resin and the like. The organic material may further be doped with hollow particles, and the organic material doped with the hollow particles is spin-coated to form the third refractive index layer.

In some embodiments, the quantum dot layers are located in part of the first opening regions; and after forming the first pixel defining layer and the plurality of quantum dot layers on the sides, facing away from the first substrate, of the light emitting devices, the method further includes:

forming first filling layers in the first opening regions except for the first opening regions in which the quantum dot layers are arranged, where an orthographic projection of the first refractive index layer on the first substrate does not overlap orthographic projections of the first filling layers on the first substrate.

In some embodiments, after forming the first filling layers in the first opening regions except for the first opening regions in which the quantum dot layers are arranged, the method further includes:

forming a fifth refractive index layer on sides, facing away from the light emitting devices, of the first filling layers: where a refractive index of the first buffer layer is not equal to a refractive index of the fifth refractive index layer: the fifth refractive index layer includes second refractive index patterns corresponding to the first filling layers one to one: orthographic projections of the second refractive index patterns on the first substrate at least cover the orthographic projections of the first filling layers on the first substrate; and the orthographic projections of the second refractive index patterns do not overlap the orthographic projections of the quantum dot layers on the first substrate.

During specific implementation, the second refractive index patterns may be formed in the regions corresponding to the first opening regions except for the first opening regions in which the quantum dot layers are arranged by adopting the PECVD process in combination with the metal mask technology.

A display apparatus provided by embodiments of the present disclosure includes the touch display panel provided by the embodiments of the present disclosure.

The display apparatus provided by the embodiments of the present disclosure is a mobile phone, a tablet computer, a television, a display, a laptop, a digital photo frame, a navigator and any product or component with a display function. Other essential components of the display apparatus shall be understood by those of ordinary skill in the art, and are omitted herein and also shall not be used as a restriction to the present disclosure. The implementation of the display apparatus may refer to the embodiments of the above touch display panel, and repetitions are omitted here.

To sum up, the embodiments of the present disclosure provide the touch display panel and the preparation method thereof, and the display apparatus. The touch display panel includes at least one layer of stacked insulation structure, the stacked insulation structure includes the second refractive index layer and the first refractive index layer which have different refractive indexes and are arranged on the sides, facing away from the light emitting devices, of the quantum dot layers in a laminated mode; and the refractive index of the second refractive index layer is greater than the refractive index of the first refractive index layer. The light interferes at an interface between the second refractive index layer and the first refractive index layer, so that a light reflectivity or transmittance within a specific wavelength range is increased. Therefore, by setting the refractive indexes of the first refractive index layer and the second refractive index layer, the light emitted by each quantum dot layer is emitted from the stacked insulation structure, the light emitted by the light emitting devices is reflected to be reused by the quantum dot layers, so that a utilization rate and a conversion rate of the light may be improved, and the front light output efficiency of the touch display panel is improved. Leakage of the light emitted by the light emitting devices may further be reduced, and the color purity of the display panel is improved. In a case of reducing the leakage of the light emitted by the light emitting devices and improving the color purity of the display panel, according to the touch display apparatus provided by the embodiments of the present disclosure, no color film needs to be arranged on the light emitting sides of the quantum dot layers, the thickness of the touch display panel may be reduced, and the cost may further be saved. In addition, according to the display panel provided by the embodiments of the present disclosure, the touch module is located on the sides, facing away from the light emitting devices, of the quantum dot layers, so that the distance between the touch module and the light emitting devices may be increased, the parasitic capacitances between the touch electrode layers in the touch module and cathodes of the light emitting devices are avoided, and the touch accuracy may be improved.

Although the preferred embodiments of the present disclosure have been described, those skilled in the art can make additional changes and modifications on these embodiments once they know the basic creative concept. So the appended claims are intended to include the preferred embodiments and all changes and modifications that fall into the scope of the present disclosure.

Apparently, those skilled in the art may perform various changes and modifications on the embodiments of the present disclosure without departing from the spirit and scope of the embodiments of the present disclosure. Therefore, if these changes and modifications on the embodiments of the present disclosure fall in the scope of the claims of the present disclosure and their equivalent technologies, the present disclosure is intended to include these changes and modifications.

The invention claimed is:

1. A touch display panel, comprising:
a first substrate, comprising a plurality of sub-pixel regions;
a plurality of light emitting devices, located on one side of the first substrate and corresponding to the plurality of sub-pixel regions one to one;
a first pixel defining layer, located on sides, facing away from the first substrate, of the plurality of light emitting devices; wherein the first pixel defining layer comprises first opening regions corresponding to the plurality of sub-pixel regions one to one;
a plurality of quantum dot layers, located on the sides, facing away from the first substrate, of the plurality of light emitting devices; wherein the plurality of quantum dot layers are in at least part of the first opening regions;
a touch module, located on sides, facing away from the plurality of light emitting devices, of the plurality of quantum dot layers; wherein the touch module comprises a first touch electrode layer; and
a stacked insulation structure between the plurality of quantum dot layers and the first touch electrode layer; wherein the stacked insulation structure comprises a first refractive index layer and a second refractive index layer arranged on a whole layer;
wherein a refractive index of the first refractive index layer is smaller than a refractive index of the second refractive index layer;
the second refractive index layer is located between the first refractive index layer and the plurality of quantum dot layers;
the first refractive index layer comprises a plurality of first refractive index patterns, and the plurality of first refractive index patterns correspond to the plurality of quantum dot layers one to one; and
orthographic projections of the plurality of first refractive index patterns on the first substrate at least cover orthographic projections of the plurality of quantum dot layers on the first substrate;
wherein the touch module further comprises: a first buffer layer between the plurality of quantum dot layers and the first touch electrode layer; a second touch electrode layer between the first touch electrode layer and the first buffer layer; and a first insulation layer between the first touch electrode layer and the second touch electrode layer;
wherein the second refractive index layer is located between the first buffer layer and the second touch electrode layer;
the first insulation layer comprises second opening regions corresponding to the plurality of quantum dot layers one to one; and
the plurality of first refractive index patterns are located in the second opening regions.

2. The touch display panel according to claim 1, wherein the plurality of quantum dot layers are in part of the first opening regions;
the touch display panel further comprises: a plurality of first filling layers, located in first opening regions except for the first opening regions in which the plurality of quantum dot layers are arranged; and an orthographic projection of the first refractive index layer on the first substrate does not overlap orthographic projections of the plurality of first filling layers on the first substrate.

3. The touch display panel according to claim 2, further comprising a first light transmission structure which is located between the plurality of first filling layers and the first touch electrode layer, and is for transmitting light emitted by the plurality of light emitting devices;
wherein the first light transmission structure comprises: a fourth refractive index layer, and a fifth refractive index layer between the fourth refractive index layer and the plurality of first filling layers;
a refractive index of the fourth refractive index layer is not equal to a refractive index of the fifth refractive index layer;
the fifth refractive index layer comprises second refractive index patterns corresponding to the plurality of first filling layers one to one;
orthographic projections of the second refractive index patterns on the first substrate at least cover the orthographic projections of the plurality of first filling layers on the first substrate; and
the orthographic projections of the second refractive index patterns on the first substrate do not overlap the orthographic projections of the plurality of quantum dot layers on the first substrate.

4. The touch display panel according to claim 3, wherein the touch module comprises a first buffer layer, and the first buffer layer is multiplexed as the fourth refractive index layer.

5. The touch display panel according to claim 4, wherein an orthographic projection of the second refractive index layer on the first substrate covers the orthographic projections of the plurality of first filling layers on the first substrate.

6. The touch display panel according to claim 5, further comprising a third refractive index layer, wherein an orthographic projection of the third refractive index layer on the first substrate covers the orthographic projections of the plurality of first filling layers on the first substrate.

7. The touch display panel according to claim 2, wherein the plurality of light emitting devices are blue light emitting devices;
the plurality of sub-pixel regions comprise a plurality of red sub-pixel regions, a plurality of blue sub-pixel regions and a plurality of green sub-pixel regions; and
the plurality of quantum dot layers are only located in the first opening regions corresponding to the red sub-pixel regions and the green sub-pixel regions.

8. The touch display panel according to claim 1, wherein the stacked insulation structure further comprises: a third refractive index layer between the first refractive index layer and the second refractive index layer;
wherein a refractive index of the third refractive index layer is smaller than the refractive index of the second refractive index layer; and
the refractive index of the third refractive index layer is not equal to the refractive index of the first refractive index layer.

9. The touch display panel according to claim 8, wherein the third refractive index layer comprises an organic matrix.

10. The touch display panel according to claim 9, wherein a material of the organic matrix comprises one or a combination of silane resin or epoxy resin.

11. The touch display panel according to claim 10, wherein the refractive index of the third refractive index layer is greater than or equal to 1.45 and smaller than or equal to 1.60.

12. The touch display panel according to claim 10, wherein the refractive index of the third refractive index layer is smaller than the refractive index of the first refractive index layer;

wherein the refractive index of the third refractive index layer is greater than or equal to 1.25 and smaller than or equal to 1.45.

13. The touch display panel according to claim 9, wherein the third refractive index layer further comprises hollow particles dispersed in the organic matrix.

14. The touch display panel according to claim 1, wherein in a direction perpendicular to the first substrate, a thickness of each of the plurality of first refractive index patterns is equal to a thickness of the first insulation layer.

15. The touch display panel according to claim 1, wherein a material of the plurality of first refractive index patterns comprises silicon oxide;

wherein a refractive index of each of the plurality of first refractive index patterns is greater than or equal to 1.45 and smaller than or equal to 1.55.

16. The touch display panel according to claim 1, wherein a material of the plurality of first refractive index patterns comprises one or a combination of: acrylic resin, polyurethane resin, silicone resin or epoxy resin;

wherein a refractive index of each of the plurality of first refractive index patterns is greater than or equal to 1.30 and smaller than or equal to 1.50.

17. The touch display panel according to claim 1, wherein a material of the second refractive index layer comprises silicon oxynitride;

wherein the refractive index of the second refractive index layer is greater than or equal to 1.65 and smaller than or equal to 1.75.

18. The touch display panel according to claim 1, wherein the touch module further comprises a second touch electrode layer;

an orthographic projection of the first touch electrode layer on the first substrate does not overlap orthographic projections of the first opening regions on the first substrate; and an orthographic projection of the second touch electrode layer on the first substrate does not overlap the orthographic projections of the first opening regions on the first substrate.

19. A display apparatus, comprising the touch display panel according to claim 1.

\* \* \* \* \*